United States Patent
Ku (10) Patent No.: US 8,963,596 B2
(45) Date of Patent: Feb. 24, 2015

(54) DELAY LOCKED LOOP AND DATA RECEPTION OF A SEMICONDUCTOR APPARATUS

(71) Applicant: SK Hynix Inc., Icheon-si Gyeonggi-do (KR)

(72) Inventor: Young Jun Ku, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 121 days.

(21) Appl. No.: 13/845,368

(22) Filed: Mar. 18, 2013

(65) Prior Publication Data

US 2014/0159789 A1  Jun. 12, 2014

(30) Foreign Application Priority Data

Dec. 11, 2012 (KR) .................. 10-2012-0143598

(51) Int. Cl.
*H03L 7/081* (2006.01)
*H03L 7/08* (2006.01)

(52) U.S. Cl.
CPC .............. *H03L 7/08* (2013.01); *H03L 7/0812* (2013.01)
USPC .... 327/158; 327/149; 365/233.1; 365/233.13

(58) Field of Classification Search
CPC .................. H03L 7/08; H03L 7/081–7/1818
USPC ........... 327/149, 158, 161; 365/233.1–233.13
See application file for complete search history.

(56) References Cited

U.S. PATENT DOCUMENTS

| 6,313,674 B1 * | 11/2001 | Akita et al. .................. 327/155 |
| 6,839,301 B2 * | 1/2005 | Lin et al. ................. 365/233.12 |
| 7,881,132 B2 * | 2/2011 | Shin .............................. 365/194 |
| 8,030,981 B2 * | 10/2011 | Kim .............................. 327/284 |

FOREIGN PATENT DOCUMENTS

| KR | 100931026 B1 | 12/2009 |
| KR | 100985410 B1 | 9/2010 |

* cited by examiner

*Primary Examiner* — Patrick O'Neill
(74) *Attorney, Agent, or Firm* — William Park & Associates Patent Ltd.

(57) ABSTRACT

A semiconductor apparatus includes: a clock receiving unit configured to receive an external clock signal and output the received clock signal as a reference clock signal; a delay locked loop (DLL) configured to delay the reference clock signal by a variable delay amount and generate a data latch clock signal; a data receiving unit configured to receive external data in synchronization with the data latch clock signal and output the received data as internal data; and a determination unit configured to detect a phase difference between the reference clock signal and the data latch clock signal and generate a determination signal, when the DLL is locked.

20 Claims, 7 Drawing Sheets

DELAY LOCKED LOOP AND DATA RECEPTION OF A SEMICONDUCTOR APPARATUS

CROSS-REFERENCES TO RELATED APPLICATION

The present application claims priority under 35 U.S.C. §119(a) to Korean application number 10-2012-0143598 filed on Dec. 11, 2012 in the Korean Intellectual Property Office, which is incorporated herein by reference in its entirety.

BACKGROUND

1. Technical Field

Various embodiments generally relate to a semiconductor apparatus, and more particularly, to data reception of a semiconductor apparatus.

2. Related Art

A semiconductor apparatus includes a data receiving unit to receive data from an external device. The current semiconductor apparatus operates in synchronization with a clock signal, in order to perform an operation at high speed. Therefore, the data receiving unit also latches data applied from the external device in synchronization with the clock signal.

Figure 1:
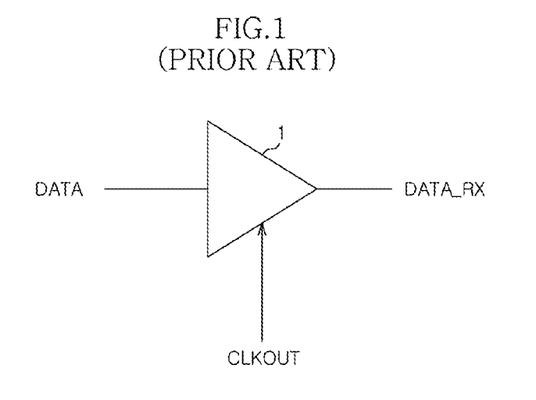
FIG. 1 is a diagram illustrating a data receiving unit of a conventional semiconductor apparatus.

Referring to FIG. 1, general data receiving unit 1 includes a plurality of receivers (not illustrated) configured to latch a plurality of external data DATA in synchronization with a data latch clock signal CLKOUT and output the latched data as a plurality of internal data DATA_TX, respectively.

Recently, a DDR (Double Data Rate) synchronous semiconductor apparatus has been used to improve operation speed. When the DDR scheme is used, data are latched at falling edges as well as rising edges of a clock signal. According to the DDR scheme, the data receiving unit 1 may latch the external data DATA at falling edges as well as rising edges of the data latch clock signal CLKOUT, thereby quickly receiving the data.

Meanwhile, the semiconductor apparatus must accurately latch the external data DATA in order to normally operate. For this operation, the phase of the data latch clock signal CLKOUT must be controlled to accurately latch the data. Furthermore, the internal data DATA_RX received according to the DDR scheme must be aligned depending on the purposes of data (or command) applied from the external device, regardless of whether the data were latched at rising edges or falling edges of the data latch clock signal CLKOUT.

SUMMARY

In an embodiment, a semiconductor apparatus includes: a clock receiving unit configured to receive an external clock signal and output the received clock signal as a reference clock signal; a delay locked loop (DLL) configured to delay the reference clock signal by a variable delay amount and generate a data latch clock signal; a data receiving unit configured to receive external data in synchronization with the data latch clock signal and output the received data as internal data; and a determination unit configured to detect a phase difference between the reference clock signal and the data latch clock signal and generate a determination signal, when the DLL is locked.

In an embodiment, a semiconductor apparatus includes: a clock receiving unit configured to receive an external clock signal and output the received signal as a reference clock signal; a DLL configured to delay the reference clock signal by a variable delay amount and generate a data latch clock signal; a data receiving unit configured to receive external data in synchronization with the data latch clock signal and output the received data as internal data; a determination unit configured to detect a phase difference between the reference clock signal and the data latch clock signal and generate a determination signal, when the DLL is locked; and a data sorting unit configured to distinguish and sort the internal data into first and second data lines in response the determination signal.

In an embodiment, a semiconductor system includes a circuit device configured to sort internal data at a rising edge of a data latch clock signal which generated in a delay locked loop (DLL) and internal data at a falling edge of the data latch clock signal using a phase difference a reference clock signal and the data latch clock signal in response to a DLL locking signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 2:
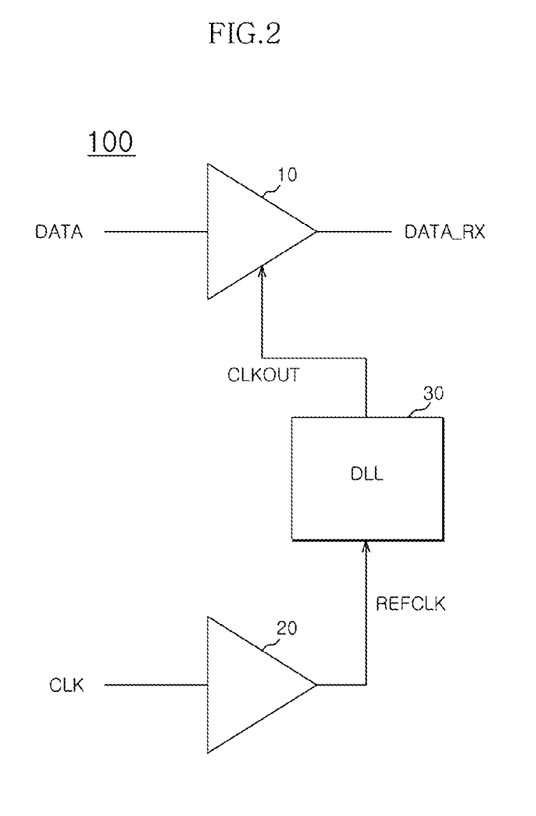
FIG. 2 is a block diagram of a semiconductor apparatus according to an embodiment of the present invention.

Referring to FIG. 2, the semiconductor apparatus 100 may include a data receiving unit 10, a clock receiving unit 20, and a delay locked loop (DLL) 30.

The data receiving unit 10 may be configured to include a plurality of receivers (not illustrated) configured to latch a plurality of external data DATA from an external device in synchronization with a data latch clock signal CLKOUT. The respective receivers may be configured to output the external data DATA as internal data DATA_RX in synchronization with the data latch clock signal CLKOUT. The respective receivers may latch the external data DATA at rising edges and falling edges of the data latch clock signal CLKOUT according to the DDR scheme.

The clock receiving unit 20 may be configured to receive an external clock signal CLK from an external device and output the received clock signal as a reference clock signal REFCLK. Ideally, the reference clock signal REFCLK may have the same phase as the external clock signal CLK.

The DLL 30 is configured to receive the reference clock signal REFCLK from the clock receiving unit 20, delay the reference clock signal REFCLK by a variable delay amount and output the delayed signal as the data latch clock signal CLKOUT. The DLL 30 may control the phase of the data latch clock signal CLKOUT and provide it to the data receiving unit 10 such that the data receiving unit 10 may accurately latch the external data DATA.

Figure 3A:
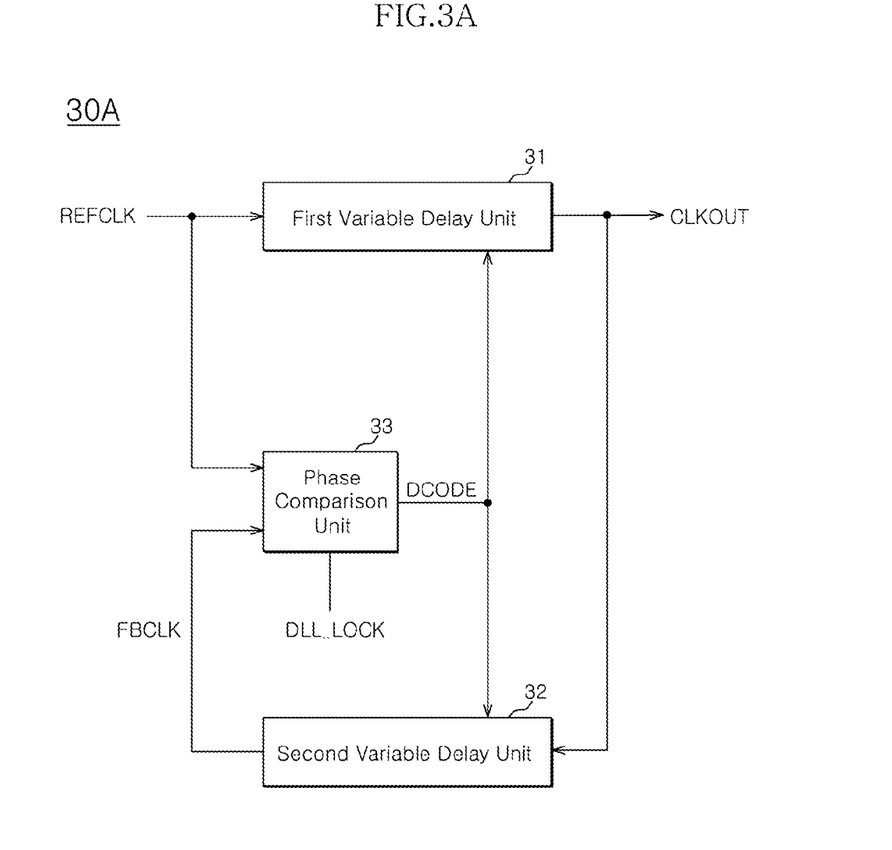
FIGS. 3A and 3B are block diagrams illustrating an embodiment of a DLL of FIG. 2.

Referring to FIG. 3A the DLL 30A may include a first variable delay unit 31, a second variable delay unit 32, and a phase comparison unit 33.

The first variable delay unit 31 may be configured to control a delay amount of the reference clock signal REFCLK in response to a delay amount control code DCODE and output the controlled signal as a data latch clock signal CLKOUT.

The second variable delay unit 32 may be configured to control a delay amount of the data latch clock signal CLKOUT in response to the delay amount control code DCODE and output the controlled signal as a feedback clock signal FBCLK.

The phase comparison unit 33 may be configured to compare the phases of the reference clock signal REFCLK and the feedback clock signal FBCLK and generate the delay amount control code DCODE according to the comparison result.

The first and second variable delay units 31 and 32 may be configured to control the delay amount of the reference clock signal REFCLK, the delay amount of the data latch clock signal CLKOUT and the feedback clock signal FBCLK to be substantially same with them, in response to the delay amount control code DCODE. That is, a phase difference between the reference clock signal REFCLK and the data latch clock signal CLKOUT is substantially equal to a phase difference between the data latch clock signal CLKOUT and the feedback clock signal FBCLK.

The phase comparison unit 33 may be configured to adjust the delay control code DCODE until an inverted reference clock signal/REFCLK has substantially the same phase as the feedback clock signal FBCLK. When the inverted reference clock signal/REFCLK has substantially the same phase as the feedback clock signal FBCLK, the DLL 30A may be locked. The phase comparison unit 33 may activate a DLL locking signal DLL_LOCK, when the DLL 30A is locked. When the inverted reference clock signal/REFCLK has substantially the same phase as the feedback clock signal FBCLK, it means that the reference clock signal REFCLK and the feedback clock signal FBCLK have a phase difference of 180 degrees. Since the first and second variable delay units 31 and 32 have substantially the same delay amount, the data latch clock signal CLKOUT may have a phase delayed by 90 degrees from the phase of the reference clock signal REFCLK. Here, the inverted reference clock signal/REFCLK may be generated using inverter (not illustrated) in an internal of the phase comparison unit 33.

Figure 3B:
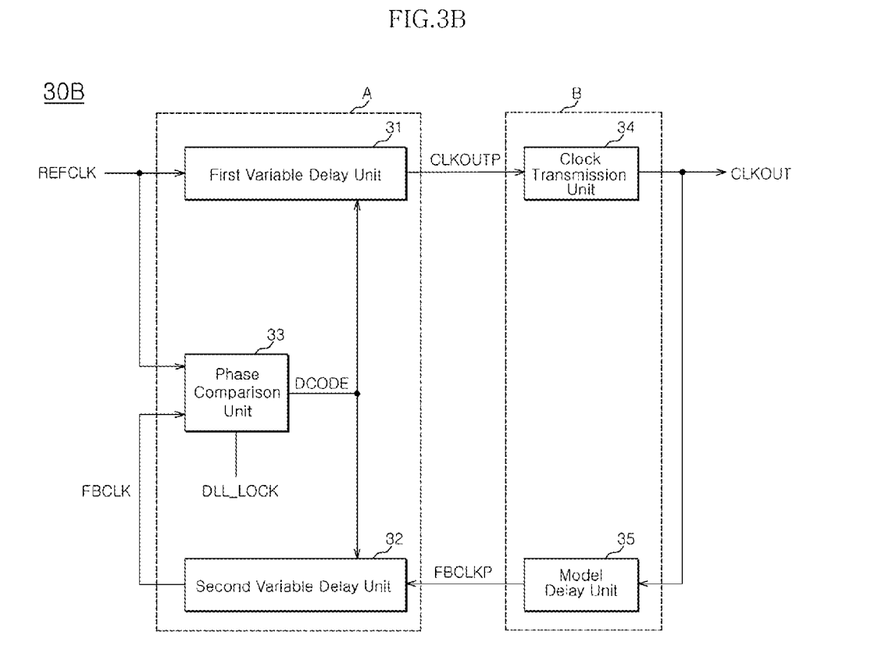

Referring to FIG. 3B, the DLL 30B may include a first DLL circuit A and a second DLL circuit B. The first DLL circuit A may be substantially same with the DLL 30A illustrated in FIG. 3A, that is, the DLL 30A may include the first and second variable delay units 31 and 32 and the phase comparison unit 33. That is, the DLL 30B may include the second DLL circuit B electrically coupled between the first variable delay unit 31 and an output terminal for outputting the data latch clock signal CLKOUT. The second DLL circuit B may include a clock transmission unit 34 and a model delay unit 35.

When the data receiving unit 10 of FIG. 2 may receive the plurality of external data DATA through the plurality of receivers (not illustrated), the DLL 30B of FIG. 3B may be configured to control the phase of the data latch clock signal CLKOUT by further considering a delay amount of a transmission path through which the data latch clock signal CLKOUT is distributed and transmitted to the respective receivers (not illustrated).

The first variable delay unit 31 may be configured to control the delay amount of the reference clock signal REFCLK in response to the delay amount control code DCODE.

The clock transmission unit 34 may be configured to receive an output clock signal CLKOUTP of the first variable delay unit 31 and output the data latch clock signal CLKOUT which is to be provided to any one of the plurality of receivers (not illustrated).

The model delay unit 35 may be configured to receive the data latch clock signal CLKOUT and delay the data latch clock signal CLKOUT by modeling the delay amount of the clock transmission unit 34.

The second variable delay unit 32 may be configured to control a delay amount of an output clock signal FBCLKP of the model delay unit 35 in response to the delay amount control code DCODE and output the controlled signal as the feedback clock signal FBCLK.

The phase comparison unit 33 may be configured to compare the phases of the reference clock signal REFCLK and the feedback clock signal FBCLK and generate the delay amount control code DCODE.

Specifically, the first and second variable delay units 31 and 32 control the delay amount of the reference clock signal REFCLK, the delay amount of the data latch clock signal CLKOUT and the delay amount of the feedback clock signal FBCLK to be substantially same with them, in response to the delay amount control code DCODE. Furthermore, the delay amount of the clock transmission unit 34 corresponding to the clock transmission path is substantially equal to the delay amount of the model delay unit 35. Therefore, the phase difference between the reference clock signal REFCLK and the data latch clock signal CLKOUT is substantially equal to the phase difference between the data latch clock signal CLKOUT and the feedback clock signal FBCLK.

The phase comparison unit 33 may adjust the delay amount control code DCODE until the inverted reference clock signal/REFCLK has substantially the same phase as the feedback clock signal FBCLK. When the inverted reference clock signal/REFCLK has substantially the same phase as the feedback clock signal FBCLK, the DLL 30B is locked. At this time, the phase comparison unit 33 activates a DLL locking signal DLL_LOCK. When the inverted clock signal of the is reference clock signal REFCLK has substantially the same phase as the feedback clock signal FBCLK, it means that the reference clock signal REFCLK and the feedback clock signal FBCLK have a phase difference of 180 degrees. Since the first and second variable delay units 31 and 32 have substantially the same delay amount, the data latch clock signal CLKOUT may have a phase delayed by 90 degree from the phase of the reference clock signal REFCLK.

In the case of a semiconductor apparatus 100 operating at high speed, an external clock signal CLK and external data DATA are applied in phase from an external device. In the semiconductor apparatus according to the embodiment, high-level data and low-level data are applied during a high-level period and a low-level period of the external clock signal CLK, respectively, based on the DDR scheme.

Figure 4A:
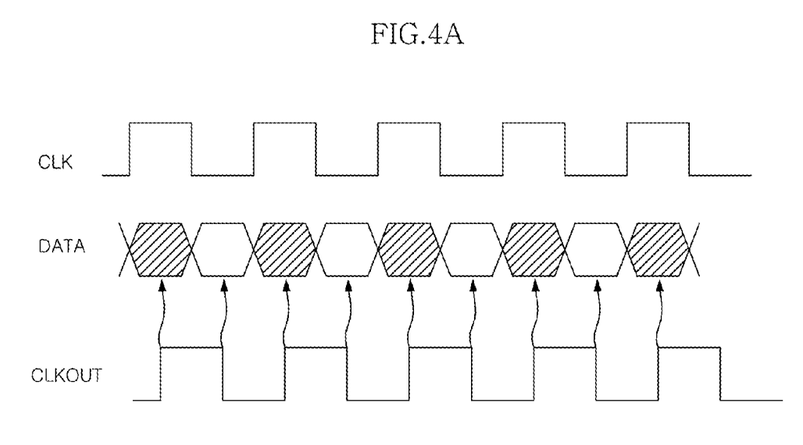
FIGS. 4A and 4B are timing diagrams illustrating the operation of the semiconductor apparatus of FIG. 2.

One receiver (not illustrated) of the data receiving unit 10 latches the external data DATA in synchronization with the data latch clock signal CLKOUT. As illustrated in FIG. 4A, the data latch clock signal CLKOUT may have a phase delayed by 90 degrees from the external clock signal CLK. Therefore, the high-level data (hatch marked) may be latched at a rising edge of the data latch clock signal CLKOUT, and the low-level data (hollow marked) is latched at a falling edge of the data latch clock signal CLKOUT.

Figure 4B:
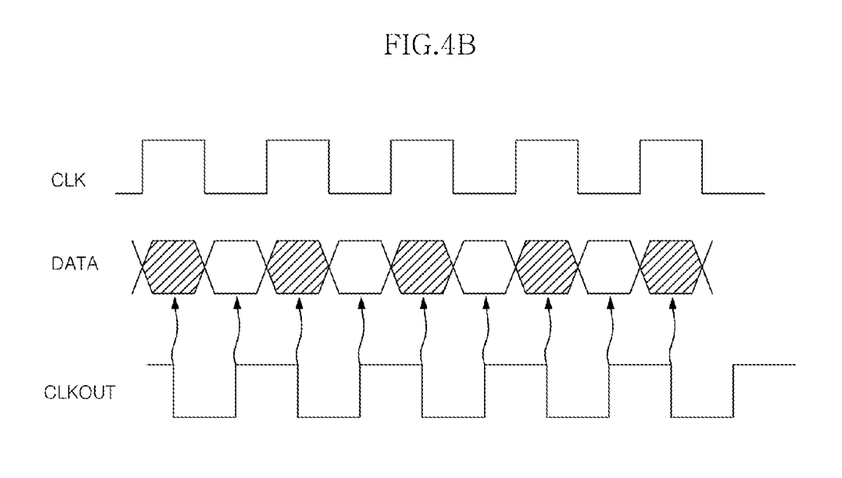

When the data latch clock signal CLKOUT and the reference clock signal REFCLK may have a phase difference of 270 degrees according to the initial setting or high-speed operation of the DLL 30, the DLL 30 may be locked. As illustrated in FIG. 4B, the data latch clock signal CLKOUT may have a phase difference of 270 degrees from the external clock signal CLK. In this case, low-level data (hollow marked) is latched at a rising edge of the data latch clock CLKOUT, and high-level data (hatch marked) is latched at a falling edge of the data latch clock CLKOUT, unlike the operation of the semiconductor apparatus illustrated in FIG. 4A.

Figure 5:
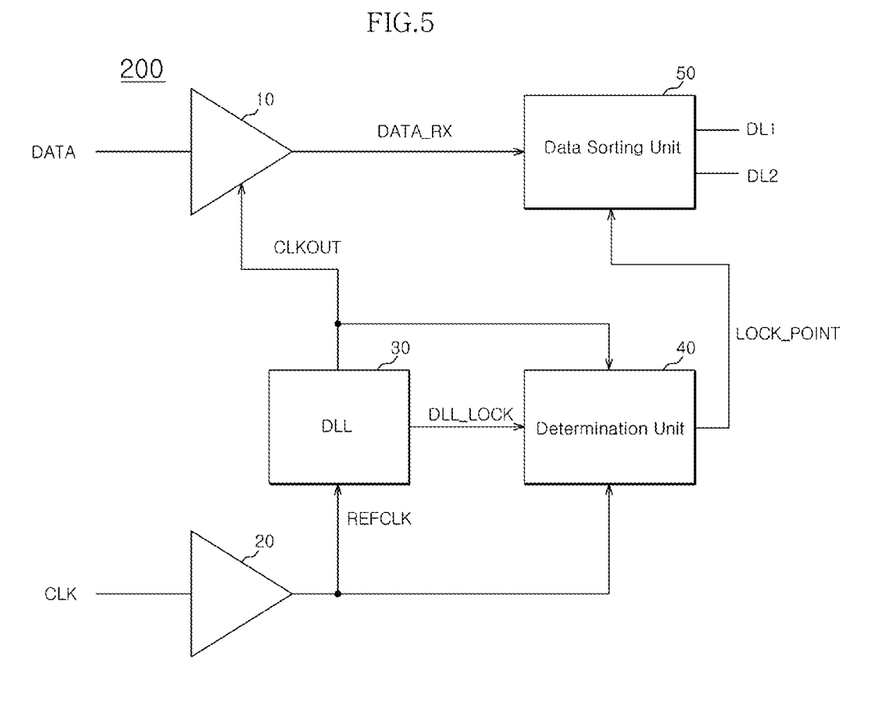
FIG. 5 is a block diagram of a semiconductor apparatus according to an embodiment of the present invention.

Referring to FIG. 5, the semiconductor apparatus 200 may include a data receiving unit 10, a clock receiving unit 20, a DLL 30, a determination unit 40, and a data sorting unit 50.

The configurations and operations of the data receiving unit 10, the clock receiving unit 20, and the DLL 30 may be the same as described with reference to FIG. 2. That is, the data receiving unit 10 may be configured to output a plurality of external data DATA as a plurality of internal data DATA_RX in synchronization with a data latch clock signal CLKOUT generated by the DLL 30.

The determination unit 40 may be configured to determine how much the phase of the data latch clock signal CLKOUT is delayed from a reference clock signal REFCLK when the DLL 30 is locked, and output a determination signal LOCK_POINT.

Figure 6:
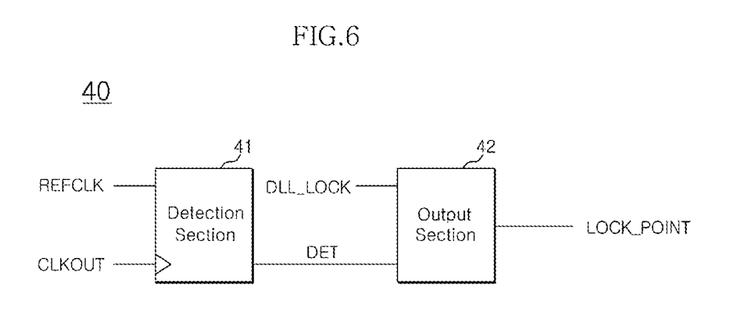
FIG. 6 is a block diagram illustrating an embodiment of a determination unit of FIG. 5.

Specifically, as illustrated in FIG. 6, the determination unit 40 may include a detection section 41 and an output section 42.

The detection section 41 may be configured to detect the level of the reference clock signal REFCLK in synchronization with the data latch clock signal CLKOUT and output a detection signal DET. The detection section 41 may be configured to generate the detection signal DET having a first level when the reference clock signal REFCLK may have a high level at a rising edge of the data latch clock signal CLKOUT. Accordingly, the DLL 30 may be locked by a phase difference between the data latch clock signal CLKOUT and the reference clock signal REFCLK being substantially 90 degrees. On the other hand, when the reference clock REFCLK may have a low level at a rising edge of the data latch clock signal CLKOUT, the detection section 41 may generate the detection signal DET having a second-level being different from the first-level. Accordingly, the DLL 30 may be locked by a phase difference between the data latch clock signal CLKOUT and the reference clock signal REFCLK being substantially 270 degrees.

The detection section 41 may include a flip-flop configured to receive the reference clock signal REFCLK in synchronization with the data latch clock signal CLKOUT as illustrated in FIG. 6.

The output section 42 may be configured to receive the detection signal DET and a DLL locking signal DLL_LOCK and output the determination signal LOCK_POINT. Further, the output section 42 may be configured to latch the detection signal DET and output the latched signal as the determination signal LOCK_POINT, when a DLL locking signal DLL_LOCK is activated. For example, when the detection signal DET having the first-level may be applied to the output section 42, the output section 42 may output the determination signal LOCK_POINT having the first-level. When the detection signal DET having the second-level may be applied to the output section 42, the output section 42 may output the determination signal LOCK_POINT having the second-level.

Figure 7A:
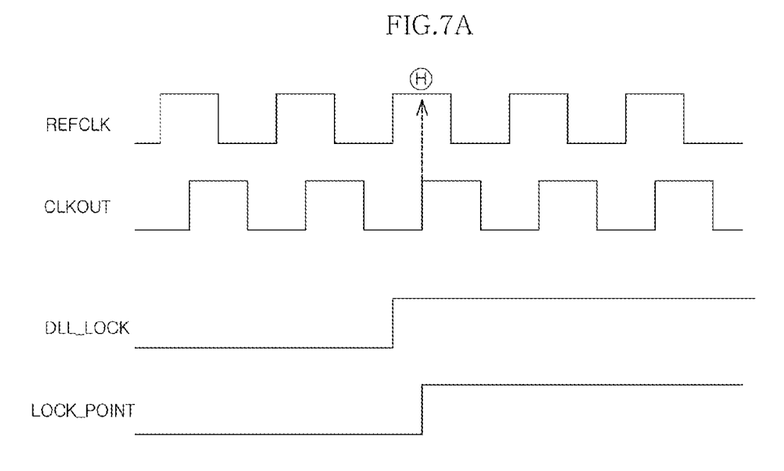
FIGS. 7A and 7B are timing diagrams illustrating the operation of the determination unit of FIGS. 5 and 6.

Referring to FIG. 7A, when the DLL locking signal DLL_LOCK is activated and the reference clock signal REFCLK and the data latch clock signal CLKOUT have a phase difference of 90 degrees, that is, the data latch clock signal CLKOUT is delayed within a high-level period H) of the reference clock signal REFCLK, the determination signal LOCK_POINT having the first-level (for example, a high-level) is generated in the determination unit 40.

Figure 7B:
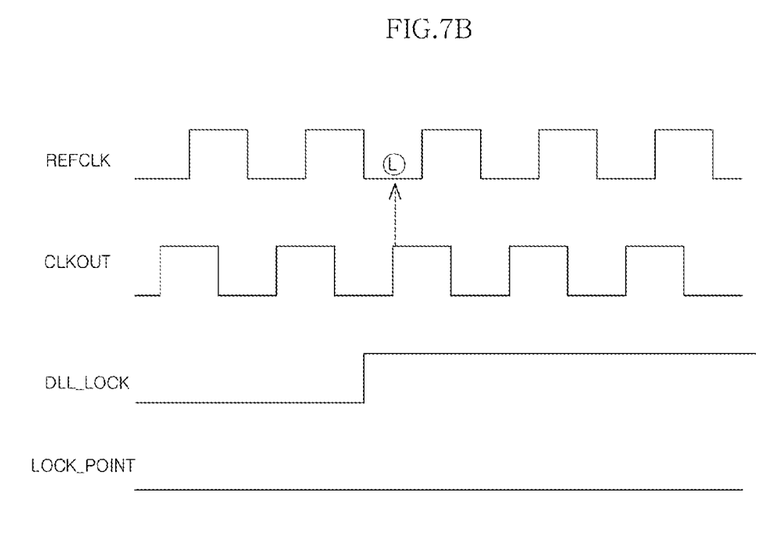

Referring to FIG. 7B, when the DLL locking signal DLL_LOCK is activated and the reference clock signal REFCLK and the data latch clock signal CLKOUT have a phase difference of 270 degrees, that is, the data latch clock signal CLKOUT is delayed within a low-level period (L) of the reference clock signal REFCLK, the determination signal LOCK_POINT having the second-level (a low-level) is generated in the determination unit 40.

The data sorting unit 50 may be configured to distinguish data having the high-level and data among the plurality of internal data DATA_RX in response to the determination signal LOCK_POINT, and sort the distinguished data into a first data line DL1 and a second data line DL2. Specifically, when the determination signal LOCK_POINT is at the first-level, the data sorting unit 50 may be configured to sort data latched at a rising edge of the data latch clock CLKOUT among the internal data DATA_RX into the first data line DL1, and sort data latched at a falling edge of the data latch clock signal CLKOUT into the second data line DL2.

When the determination signal LOCK_POINT is at the second-level, the data sorting unit 50 may sort data latched at a falling edge of the data latch clock signal CLKOUT among the internal data DATA_RX into the first data line DL1, and sort data latched at a rising edge of the data latch clock signal CLKOUT into the second data line DL2.

Figure 8:
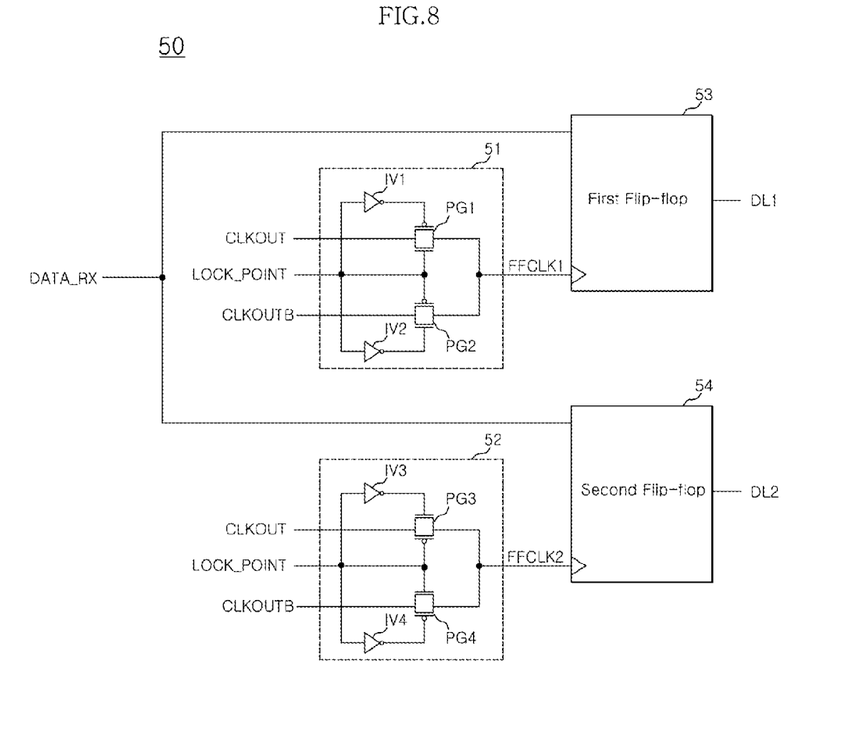
FIG. 8 is a diagram illustrating an embodiment of a data sorting unit of FIG. 5.

The data sorting unit 50 may include a first clock section 51, a second clock selection section 52, a first flip-flop 53 and a second flip-flop 54.

The first clock selection section 51 may be configured to provide any one of the data latch clock signal CLKOUT and an inverted data latch clock signal CLKOUTB as a first clock signal FFCLK1 in response to the determination signal LOCK_POINT. The first clock selection section 51 may be configured to select and provide the data latch clock signal CLKOUT when the determination signal LOCK_POINT is activated to the first-level, and select and provide the inverted data latch clock signal CLKOUTB when the determination signal LOCK_POINT is deactivated to the second-level.

The first clock selection section 51 may include first and second inverters IV1 and IV2 and first and second pass gates PG1 and PG2. The first and second inverters IV1 and IV2 may be configured to invert the determination signal LOCK_POINT and generate the inverted determination signal. The first and second pass gates PG1 and PG2 may be configured to selectively output the data latch clock signal CLKOUT and the inverted data latch clock signal CLKOUTB in response to the determination signal LOCK_POINT and the inverted determination signal, respectively.

The second clock selection section 52 may be configured to provide any one of the data latch clock signal CLKOUT and the inverted data latch clock signal CLKOUTB as a second clock signal FFCLK2 in response to the determination signal LOCK_POINT. The second clock selection section 52 may select and provide the inverted data latch clock signal CLKOUTB when the determination signal LOCK_POINT is activated to the first-level, and selects and provides the data latch clock signal CLKOUT when the determination signal LOCK_POINT is deactivated to the second-level.

The second clock selection section 52 may include third and fourth inverters IV3 and IV4 and third and fourth pass gates PG3 and PG4. The third and fourth inverters IV3 and IV4 may be configured to invert the determination signal LOCK_POINT and generate the inverted determination signal. The third and fourth pass gates PG3 and PG4 may be configured to selectively output the data latch clock signal CLKOUT and the inverted data latch clock signal CLKOUTB in response to the determination signal LOCK_POINT and the inverted determination signal, respectively.

The first flip-flop 53 may be configured to latch the internal data DATA_RX in response to the first clock signal FFCLK1 and output the latched data to the first data line DL1. Specifically, the first flip-flop 53 may latch the internal data DATA_RX at a rising edge of the first clock signal FFCLK1.

The second flip-flop 54 may be configured to latch the internal data DATA_RX in response to the second clock signal FFCLK2 and output the latched data to the second data line DL2. Specifically, the second flip-flop 54 may latch the internal data DATA_RX at a rising edge of the second clock signal FFCLK2.

Therefore, when the determination signal LOCK_POINT is activated to the first level, the internal data DATA_RX latched at the rising edge of the data latch clock signal CLKOUT is transmitted to the first data line DL1, and the internal data DATA_RX latched at the falling edge of the data latch clock signal CLKOUT is transmitted to the second data line DL2.

On the other hand, when the determination signal LOCK_POINT is deactivated to the second level, the internal data DATA_RX latched at the rising edge of the data latch clock signal CLKOUT may be transmitted to the second data line DL2, and the internal data DATA_RX latched at the falling edge of the data latch clock signal CLKOUT may be transmitted to the first data line DL1.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a clock receiving unit configured to receive an external clock signal and generate a reference clock signal;
    a delay locked loop (DLL) configured to delay the reference clock signal by a variable delay amount and generate a data latch clock signal;
    a data receiving unit configured to receive external data in synchronization with the data latch clock signal and generate internal data; and
    a determination unit configured to detect a phase difference between the reference clock signal and the data latch clock signal and generate a determination signal, when the DLL is locked.

2. The semiconductor apparatus according to claim 1, wherein the DLL comprises:
    a first variable delay unit configured to control a delay amount of the reference clock signal in response to a delay amount control code and generate the data latch clock signal;
    a second variable delay unit configured to control a delay amount of the data latch clock signal in response to the delay amount control code and generate a feedback clock signal; and
    a phase comparison unit configured to compare the phases of the reference clock signal and the feedback clock signal and generate the delay amount control code.

3. The semiconductor apparatus according to claim 2, wherein the first and second variable delay units are configured to control the delay amounts to substantially the same amount in response to the delay amount control code.

4. The semiconductor apparatus according to claim 3, wherein the phase comparison unit is configured to generate a DLL locking signal indicating that the DLL is locked, when an inverted reference clock signal has substantially the same phase as the feedback clock signal.

5. The semiconductor apparatus according to claim 1, wherein the determination unit comprises:
    a detection section configured to detect a level of the reference clock signal in synchronization with the data latch clock signal and generate a detection signal; and
    an output section configured to output the determination signal in response to the detection signal, when the DLL is locked.

6. The semiconductor apparatus according to claim 5, wherein the detection section is configured to generate the detection signal having a first-level when the reference clock signal has a high level at a rising edge of the data latch clock signal, and generate the detection signal having a second-level when the reference clock signal has a low level at the rising edge of the data latch clock signal.

7. The semiconductor apparatus according to claim 6, wherein the output section is configured to output the determination signal having the first-level when the detection signal having the first-level is inputted, and output the determination signal having the second-level when the detection signal having the second-level is inputted.

8. A semiconductor apparatus comprising:
    a clock receiving unit configured to receive an external clock signal and generate a reference clock signal using the external clock signal;
    a delay locked loop (DLL) configured to delay the reference clock signal by a variable delay amount and generate a data latch clock signal;
    a data receiving unit configured to receive external data in synchronization with the data latch clock signal and generate the received data as internal data;
    a determination unit configured to detect a phase difference between the reference clock signal and the data latch clock signal and generate a determination signal, when the DLL is locked; and
    a data sorting unit configured to distinguish and sort the internal data into first and second data lines in response the determination signal.

9. The semiconductor integrated apparatus according to claim 8, wherein the DLL comprises:
    a first variable delay unit configured to control a delay amount of the reference clock signal in response to a delay amount control code;
    a clock transmission unit configured to transmit an output clock signal of the first variable delay unit as the data latch clock signal which is to be provided to the data receiving unit;
    a model delay unit configured to delay the data latch clock signal by modeling a delay amount of the clock transmission unit;

a second variable delay unit configured to control a delay amount of an output clock signal of the model delay unit in response to the delay amount control code and generate a feedback clock signal; and a phase comparison unit configured to compare the phases of the reference clock signal and the feedback clock signal and generate the delay amount control code.

10. The semiconductor apparatus according to claim 9, wherein the first and second variable delay units control the delay amounts to substantially the same amount in response to the delay amount control code.

11. The semiconductor apparatus according to claim 10, wherein the phase comparison unit is configured to generate a DLL locking signal indicating that the DLL is locked, when an inverted reference clock signal has substantially the same phase as the feedback clock signal.

12. The semiconductor apparatus according to claim 8, wherein the determination unit comprises:

a detection section configured to detect a level of the reference clock signal in synchronization with the data latch clock signal and generate a detection signal; and an output section configured to output the determination signal in response to the detection signal, when the DLL is locked.

13. The semiconductor apparatus according to claim 12, wherein the detection section is configured to generate the detection signal having a first-level when the reference clock signal has a high level at a rising edge of the data latch clock signal, and generate the detection signal having a second level when the reference clock signal has a low level at the rising edge of the data latch clock signal.

14. The semiconductor apparatus according to claim 8, wherein the external clock signal and the external data are inputted in the clock receiving unit and the data receiving unit, with a same phase, respectively.

15. The semiconductor apparatus according to claim 14, wherein, when the determination signal is activated to a first level, the data sorting unit is configured to sort data latched at a rising edge of the data latch clock signal among the internal data into the first data line, and sort data latched at a falling edge of the data latch clock signal into the second data line, and when the determination signal is deactivated to a second level, the data sorting unit is configured to sort data latched at the falling edge of the data latch clock signal among the internal data into the first data line, and sort data latched at the rising edge of the data latch clock signal into the second data line.

16. The semiconductor apparatus according to claim 14, wherein the data sorting unit comprises:

a first clock selection section configured to select any one of the data latch clock signal and an inverted data latch clock signal in response to the determination signal and output the selected signal as a first clock signal;

a first flip-flop configured to latch the internal data in synchronization with the first clock signal and output the latched data to the first data line;

a second clock selection section configured to select any one of the data latch clock signal and the inverted data latch clock signal in response to the determination signal and output the selected signal as a second clock signal; and a second flip-flop configured to latch the internal data in synchronization with the second clock signal and output the latched data to the second data line.

17. The semiconductor apparatus according to claim 16, wherein the first clock selection section is configured to provide the data latch clock signal as the first clock signal when the determination signal is activated to a first level, and provide the inverted data latch clock signal as the first clock signal when the determination signal is deactivated to a second level.

18. The semiconductor apparatus according to claim 17, wherein the second clock selection section is configured to provide the inverted data latch clock signal as the second clock signal when the determination signal is activated to the first level, and provide the data latch clock signal as the second clock signal when the determination signal is deactivated to the second level.

19. A semiconductor system comprising:

a circuit device configured to sort internal data at a rising edge of a data latch clock signal which is generated in a delay locked loop (DLL) and internal data at a falling edge of the data latch clock signal using a phase difference between a reference clock signal and the data latch clock signal in response to a DLL locking signal.

20. The semiconductor system according to claim 19, wherein the circuit is configured to provide the internal data at the rising edge of a data latch clock signal to a first data line, and internal data at the falling edge of the data latch clock signal to a second data line, when the DLL is locked.

* * * * *